(12) United States Patent
Kawabata et al.

(10) Patent No.: US 8,303,752 B2
(45) Date of Patent: Nov. 6, 2012

(54) METHOD OF MANUFACTURING WIRING BOARD

(75) Inventors: Kenichi Kawabata, Tokyo (JP); Hiroshige Ohkawa, Tokyo (JP)

(73) Assignee: TDK Corporation, Tokyo (JP)

( * ) Notice: Subject to any disclaimer, the term of this patent is extended or adjusted under 35 U.S.C. 154(b) by 90 days.

(21) Appl. No.: 12/461,818

(22) Filed: Aug. 25, 2009

(65) Prior Publication Data
US 2010/0051189 A1 Mar. 4, 2010

(30) Foreign Application Priority Data
Aug. 29, 2008 (JP) ................. 2008-220961

(51) Int. Cl.
*B32B 38/10* (2006.01)
(52) U.S. Cl. ............ 156/247; 156/182; 156/77; 156/79; 156/709; 156/701; 29/825; 29/829; 29/830
(58) Field of Classification Search .............. 156/182, 156/247, 344, 77, 78, 79, 701, 709, 307.7; 29/825, 829, 830
See application file for complete search history.

(56) References Cited

U.S. PATENT DOCUMENTS

| | | | |
|---|---|---|---|
| 6,748,652 B2 * | 6/2004 | Andou et al. | 29/852 |
| 7,341,924 B2 * | 3/2008 | Takayama et al. | 438/455 |
| 7,591,921 B2 * | 9/2009 | Fukui et al. | 156/344 |
| 2001/0019780 A1 | 9/2001 | Obata et al. | |
| 2004/0067377 A1 | 4/2004 | Sugimoto et al. | |
| 2006/0057341 A1 | 3/2006 | Kawabata et al. | |
| 2007/0119541 A1 | 5/2007 | Kawabata et al. | |
| 2007/0141759 A1 | 6/2007 | Nagase et al. | |

FOREIGN PATENT DOCUMENTS

| | | |
|---|---|---|
| JP | B2-3370636 | 1/2003 |
| JP | A-2005-193407 | 7/2005 |
| JP | A-2005-243999 | 9/2005 |
| JP | A-2006-086339 | 3/2006 |
| JP | A-2006-128519 | 5/2006 |
| JP | A-2006-128520 | 5/2006 |
| JP | A-2007-150002 | 6/2007 |
| JP | A-2007-173276 | 7/2007 |
| JP | A-2007-173622 | 7/2007 |
| JP | A-2007-188986 | 7/2007 |
| JP | B2-3973197 | 9/2007 |

* cited by examiner

*Primary Examiner* — Khanh P Nguyen
*Assistant Examiner* — Margaret Squalls
(74) *Attorney, Agent, or Firm* — Oliff & Berridge, PLC

(57) ABSTRACT

Provided is a method of manufacturing a wiring board, in which: a composite adhesive sheet 20 is attached to one of the surfaces of a support substrate 10, and a double-sided CCL 30 is attached to the other surface. Then, in an integrated state of the above components, a multilayer wiring structure including a conductive layer and a resin insulating layer is formed on a metal layer 33 of the double-sided CCL 30 by a known build-up method. A thermally foamable adhesive layer 22 of the composite adhesive sheet 20 is then heated, thereby thermally decomposing a thermal foaming agent to generate gas, and the support substrate 10 is separated from the remaining bonded body. Thereafter, a carrier foil layer 32b and a copper foil layer 32a of a carrier-foil coated copper foil 32 are mechanically peeled from each other at a boundary between both the layers, thereby obtaining a wiring board 1.

4 Claims, 2 Drawing Sheets

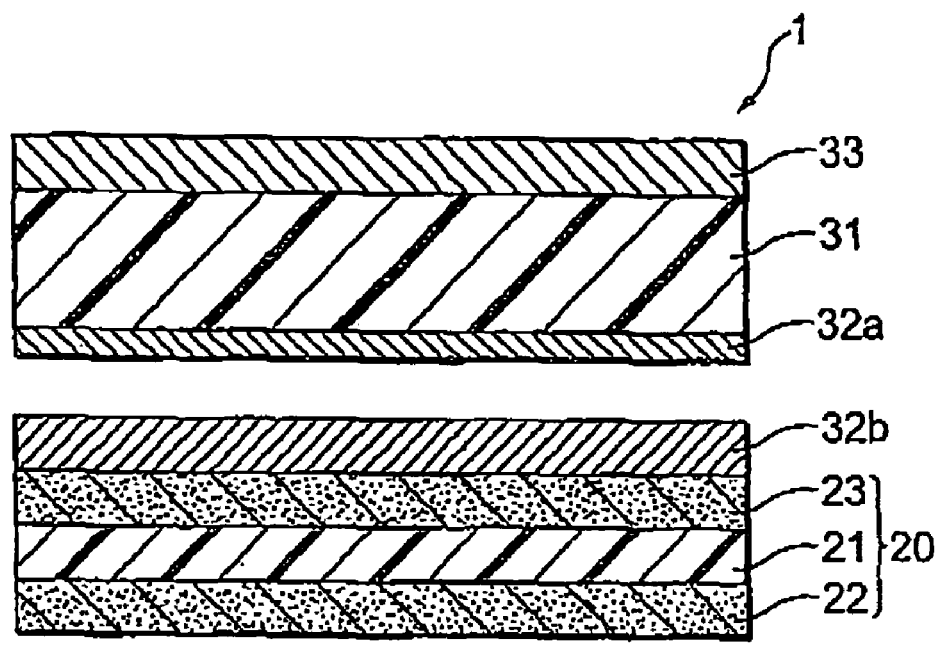

METHOD OF MANUFACTURING WIRING BOARD

CROSS-REFERENCES TO RELATED APPLICATIONS

The entire disclosure of Japanese Patent Application No. 2008-220961, filed on Aug. 29, 2008, is expressly incorporated herein by reference.

BACKGROUND

1. Technical Field

The present invention relates to a method of manufacturing a wiring board (substrate).

2. Related Art

In recent years, there has been more demand than ever before for the demand for electronic equipment including portable equipment typified by, e.g., mobile telephones to be provided in higher-density packaging. In order to respond to this demand, higher-density wiring and an increase in the number of terminals have been eagerly sought for substrate modules and wiring boards which are provided with electronic components. Examples of such wiring boards include various kinds of build-up multilayer wiring boards such as one having, on an insulating core layer, a stacked layers structure obtained by alternately laminating insulating layers or dielectric layers, which are made of organic resin, and conductive layers. Examples of core layers include a thick layer in which a core material made of, e.g., glass cloth is impregnated with resin. Such a core layer prevents distortion, deformation, etc., of a substrate which might be caused during manufacturing.

However, when using the above core layer, a wiring board that is the final product becomes excessively thick, and this may not satisfy the recent demand for a reduction in thickness of wiring boards. In light of this, a method in which a wiring board is constituted only by thin resin layers and conductive layers other than a core layer can be employed. However, this method causes a large distortion in the resin layers due to the influence of heat applied during manufacturing and moisture. This will cause connection failures when an electrode pitch of, e.g., a semiconductor IC built into a wiring board is narrow. Also, a wiring board having a thickness of several tens of μm or less has been developed in order to help to attain a reduction in thickness and in height of wiring boards. However, the above wiring board tends to have a structural defect such as a warp or a crack during handling.

On the other hand, for example, JP2007-173622 A discloses a method including the steps of: forming a substrate stacked layers (laminated body) on a support substrate through a heat-peelable adhesive agent layer and an auxiliary conductive layer, and separating the substrate stacked layers from the support substrate at the boundary between the adhesive agent layer and the auxiliary conductive layer. Also, JP2005-243999 A discloses a method including the steps of: sequentially providing, on a support substrate, a base dielectric layer, a sheet base, a heat-peelable adhesion layer, and a dielectric layer; forming a stacked layers (laminated) structure of wiring thereon by a build-up process or the like; and then peeling the adhesion layer from the dielectric layer, thereby separating the stacked layers structure from the support substrate.

However, in the current manufacturing of a multilayer wiring board by a build-up process, there is a tendency for overlaying a large number of extremely thin resin layers. According to the inventor's finding, it has been found that performing heat treatment and pressure treatment many times on a support substrate leads to noticeable deterioration of an adhesive or adhesive agent layer (resin) that supports the support substrate in a fixed manner. For example, in the method disclosed in JP2007-173622 A, there is concern that a part of the deteriorated adhesive agent layer adheres to the stacked layers structure separated from the support substrate, and if this state remains, it becomes difficult for the subsequent wiring process, etc., to be performed. Also, the method disclosed in JP2005-243999 A shows a tendency concerning, in particular, noticeable deterioration of a sheet base. The residue of the sheet base adheres to the stacked layers structure, and thus becomes difficult to be removed, which negatively affects the subsequent wiring process, etc. Moreover, the sheet base and the adhesion layer which adhere to the base dielectric layer remain on the support substrate, and this makes the support substrate difficult to be recycled (reused).

SUMMARY

The present invention has been made in light of the above circumstances, and therefore has an object to provide a method of manufacturing a wiring board with which: when forming a multilayer wiring structure by a build-up process or the like, distortion and deformation of the wiring board, which might be caused during manufacturing, are sufficiently prevented, and also an adhesive, etc., are prevented from adhering to the multilayer wiring structure formed on a support substrate, thereby reducing the effect on the subsequent manufacturing process, leading to improved productivity; and recycling of the support substrate is attained.

In order to attain the above object, the method of manufacturing a wiring board according to the invention is a method of manufacturing a wiring board having a stacked layers structure including a conductive layer and an insulating layer, including the steps of: preparing a support substrate; providing, on the support substrate, a first composite body having a thermally foamable adhesive layer containing a thermal foaming agent and an adhesive layer, to have the thermally foamable adhesive layer attached to the support substrate; providing, on the first composite body, a second composite body having carrier-foil coated metal foil, which includes a carrier foil layer and a metal foil layer, and a resin insulating layer formed on the metal foil layer, to have the carrier foil layer attached to the first composite body; forming the stacked layers structure including the conductive layer and the insulating layer on the second composite body; heating the thermally foamable adhesive layer to separate the support substrate from (a bonded body of the first composite body, the second composite body, and the stacked layers structure; and separating (a bonded body of) the metal foil layer and the stacked layers structure from (a bonded body of) the carrier foil layer and the first composite body at a boundary between the carrier foil layer and the metal foil layer. In short, the metal foil layer and the stacked layers structure, which are finally separated, constitute the wiring board of the present invention.

In the wiring board manufacturing method with the above structure, the second composite body is attached to the support substrate through the first composite body, forming an integrated body, and the stacked layers structure obtained by laminating the conductive layer and the resin insulating layer is formed on the integrated body. Accordingly, dimensional changes, distortion, deformation, etc., of the stacked layers structure, which might be caused due to rigidity and tenacity of the support substrate during manufacturing, are prevented.

After forming the stacked layers structure on the second composite body, the thermally foamable adhesive layer in the first composite body is heated, whereby the thermal foaming agent contained in that layer is thermally decomposed to generate gas, and that gas breaks through the thermally foamable adhesive layer to be released to the outside. As a result, the adhesion area between the thermally foamable adhesive layer and the support substrate is reduced. Therefore, the support substrate and the first composite body are separated from each other at the adhesion boundary therebetween; alternatively, both become easily separable, and so are mechanically peeled from each other for the separation. Accordingly, an adhesive component in the thermally foamable adhesive layer becomes difficult to adhere to the support substrate, which eliminates the troublesome process involved with removing the adhesive component from the support substrate, enabling simple recycling of the support substrate.

Moreover, after performing the separation of the support substrate, the carrier foil layer is peeled from the carrier-foil coated metal foil, whereby the bonded body constituted by the metal foil layer and the stacked layers structure is separated from the bonded body constituted by the carrier foil layer and the first composite body. As a result, the adhesive component in the adhesive layer does not adhere to the bonded body constituted by the metal foil layer and the stacked layers structure (i.e., the wiring board), and outer layer wiring can be formed reliably and simply in the metal foil layer. Accordingly, productivity and reliability of the wiring board can be improved. Furthermore, the carrier-foil coated metal foil is formed by bonding the metal foil layer and the carrier foil layer, which are formed as separate members, and therefore, the metal foil layer is easily formable with a small and uniform thickness. Accordingly, the minute outer layer wiring can be formed in the metal foil layer.

From the above viewpoint, for the metal foil layer and the stacked layers structure which are separated from the carrier foil layer and the first composite body, it is preferable that a step of patterning the metal foil layer to form outer layer wiring is provided.

Furthermore, the materials for the support substrate are not particularly limited, and include, for example, materials used for a conventional core substrate, and metal. From the viewpoint of shape stability in the heating process of the manufacturing process, a support substrate made of metal is preferably used.

More specifically, a structure in which the first composite body has a base provided between a thermally foamable adhesive layer and an adhesive layer can be given as an example. This structure has the advantage that the thermally foamable adhesive layer can be separated from the adhesive layer more easily.

According to the invention, a second composite body is attached to a support substrate through a first composite body, forming an integrated body; a stacked layers structure obtained by laminating a conductive layer and a resin insulating layer is formed thereon; thereafter, separation of the support substrate is performed; and further, separation for removal of a carrier foil layer in the second composite body is performed, whereby a wiring board having a metal foil layer and the stacked layers structure is obtained. Accordingly, dimensional changes, distortion, deformation, etc., of the wiring board, which might be caused during manufacturing, can be sufficiently prevented, and also an adhesive, etc., are prevented from adhering to the stacked layers structure formed on the support substrate, thereby reducing the effect on the subsequent manufacturing process, leading to improved productivity and reliability of the wiring board. Also, recycling of the support substrate can be performed reliably and simply.

BRIEF DESCRIPTION OF THE DRAWINGS

FIG. 3 is a process drawing showing a state of manufacturing of a wiring board in accordance with an embodiment of a method of manufacturing a wiring board according to the invention.

DESCRIPTION OF EXEMPLARY EMBODIMENTS

Figure 1:
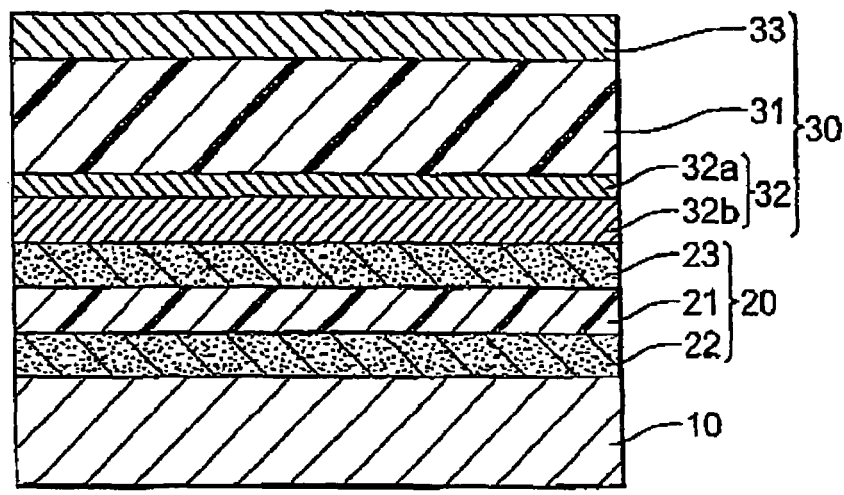
FIG. 1 is a process drawing showing a state of manufacturing of a wiring board in accordance with an embodiment of a method of manufacturing a wiring board according to the invention.

An embodiment of the invention will hereinafter be described in detail. Note that like components are denoted by like reference symbols and will not be further explained. It is assumed that vertical and horizontal positional relations are based on the positional relations shown in the drawings, unless otherwise specified. Also, a dimensional ratio of the drawings is not limited to a shown ratio. Moreover, the following embodiment is for explaining the invention, and is not intended to limit the invention to the embodiment only. Furthermore, various modifications of the invention may be made without departing from the gist of the invention.

Figure 2:
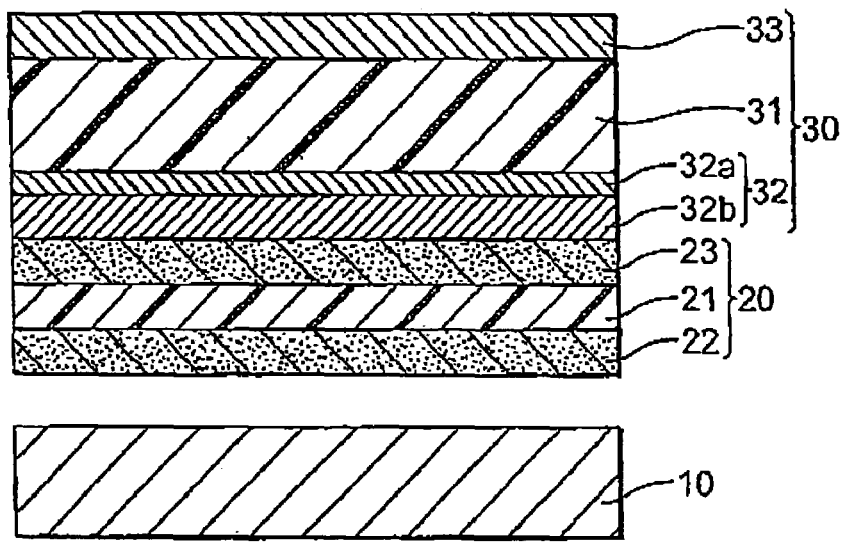
FIG. 2 is a process drawing showing a state of manufacturing of a wiring board in accordance with an embodiment of a method of manufacturing a wiring board according to the invention.

FIGS. 1 to 3 each are a process drawing showing a state of manufacturing of a wiring board in accordance with an embodiment of a method of manufacturing a wiring board according to the invention. In this embodiment, first, a support substrate 10 is prepared. Materials for the support substrate 10 are not particularly limited as long as the change in dimension and in shape falls within a desired range via heating/cooling, moisture absorption/drying, etc. Examples of the support substrate 10 include a metal substrate made of SUS or the like, and a resin substrate in which a core material of glass cloth or the like is impregnated with resin. The metal substrate made of SUS or the like is preferably employed from the viewpoint of shape stability in the heating process of the manufacturing procedure.

Next, a composite adhesive sheet 20 (first composite body) is bonded to one of the surfaces of the support substrate 10 (FIG. 1), and both are subjected to press molding with an appropriate pressure as required. The composite adhesive sheet 20 has a configuration in which: a thermally foamable adhesive layer 22 having an adhesion property with respect to the support substrate 10 is provided on one of the surfaces of a base 21 formed of, e.g., a resin film such as a polyethylene terephthalate (PET) film; and an adhesive layer 23 having an adhesion property with respect to a carrier foil layer 32b described later is provided on the other surface of the base 21. The composite adhesive sheet 20 is laminated to the support substrate 10 such that the thermally foamable adhesive layer 22 is bonded to an upper surface (shown in the figure) of the support substrate 10.

The thermally foamable adhesive layer 22 contains not only, for example, adhesive polymer such as adhesive acrylic polymer (including degeneration polymer) which is obtained by polymerizing a polymer precursor containing polymeric monomer mainly containing acrylic monomer, but also an appropriate additive such as a thermal foaming agent or a foaming assistant. The thermal foaming agent is decomposed by heat and generates gas such as carbon dioxide, nitrogen, or ammonia, thereby defining a foaming structure of the thermally foamable adhesive layer 22. A part or all of the generated gas breaks through the thermally foamable adhesive layer 22 to be released to the outside. Examples of such thermal foaming agents include known compounds including: inorganic foaming agents such as ammonium bicarbonate and ammonium nitrite; nitroso compounds such as N,N'-dinitroso pentamethylenetetramine; azo compounds such as azodicarbonamide and azobisisobutyronitrile; and sulfonyl hydrazide compounds such as benzenesulfonyl hydrazide, p-toluenesulfonyl hydrazide, and oxybis(benzenesulfonyl hydrazide).

Next, a double-sided CCL (copper clad laminate) 30 serving as a second composite body is attached to a bonded body of the support substrate 10 and the composite adhesive sheet 20 (FIG. 1), and both are subjected to press molding with an appropriate pressure as required. The double-sided CCL 30 has a configuration in which: carrier-foil coated copper foil 32 (carrier-foil coated metal foil) is provided on one of the surfaces of a resin insulating layer 31; and a metal layer 33 such as low profile copper foil having a roughened surface with a small surface roughness, which is generally referred to as an M surface, is provided on the other surface of the resin insulating layer 31. In other words, the resin insulating layer 31 and the metal layer 33 constitute a so-called RCC (resin coated copper) structure.

Examples of the materials used for the resin insulating layer 31 specifically include: a single element selected from the group consisting of vinyl benzyl resin, poly(vinyl benzyl ether) compound resin, bismaleimidetriazine resin (BT resin), polyphenylene ether (polyphenylene ether oxide) resin (PPE,PPO)), cyanate ester resin, epoxy+activated ester curing resin, polyphenylene ether resin(polyphenylene oxide resin), curable polyolefin resin, benzocyclobutene resin, polyimide resin, aromatic polyester resin, aromatic liquid crystal polyester resin, polyphenylene sulfide resin, polyether imide resin, polyacrylate resin, poly(etheretherketone)resin, fluororesin, epoxy resin, phenolic resin, and benzoxazine resin; a material obtained by adding silica, talc, calcium carbonate, magnesium carbonate, aluminum hydroxide, magnesium hydroxide, aluminum borate whiskers, potassium titanate fiber, alumina, glass flakes, glass fiber, tantalum nitride, aluminum nitride, or the like to one of the above resins, a material obtained by adding metal oxide powder containing at least one metal selected from the group consisting of magnesium, silicon, titanium, zinc, calcium, strontium, zirconium, tin, neodymium, samarium, aluminum, bismuth, lead, lanthanum, lithium, and tantalum to one of the above resins; a material obtained by blending, e.g., resin fiber such as glass fiber or aramid fiber to one of the above resins; and a material obtained by making glass cloth, aramid fiber, non-woven fabric, or the like impregnated with one of the above resins. An appropriate selection from among the above examples can be performed from the viewpoints of electrical characteristics, mechanical characteristics, water absorption properties, reflow durability, etc.

The carrier-foil coated copper foil 32 has a configuration in which a copper foil layer 32a (metal foil layer) bonded to the surface of the resin insulating layer 31 and the carrier foil layer 32b are laminated through a nitrogen-containing organic compound such as a substituted triazole compound, a sulfur-containing organic compound such as mercaptobenzothiazol, or an organic bonding layer (not shown) such as carboxylic acid. Examples of the carrier-foil coated copper foil 32 and the relevant manufacturing method include those disclosed in JP3370636 B.

Next, in the state where the support substrate 10, the composite adhesive sheet 20, and the double-sided CCL 30 are integrally formed, a desired multilayer wiring structure, which is a stacked layers structure including conductive layers and resin insulating layers, is formed on the metal layer 33 of the double-sided CCL 30 by a known build-up method. Examples of such multilayer wiring structures and the relevant forming methods include a multilayer circuit board and a method for manufacturing the same in JP2007-188986 A (US2007 119541 A1), a method for manufacturing an IC-embedded substrate in JP2007-173276 A (US2007 141759 A1], a semiconductor IC-embedded board and a method for manufacturing the same in JP2007-150002 A (US2007 119541 A1), a method of manufacturing a multilayer substrate in JP2006-128520 A, a method of manufacturing a multilayer substrate in JP2006-128519 A, a multilayer substrate and a manufacturing method thereof in JP2006-086339 A (US2006 057341 A1), and an electronic component and a multilayer substrate in JP2005-193407 A, all of which were filed by the present applicant. Note that, in this specification, the above multilayer wiring structures are not shown in the figures in order to avoid redundant descriptions.

Subsequently, the thermally foamable adhesive layer 22 of the composite adhesive sheet 20 is heated, thereby thermally decomposing the thermal foaming agent contained in that layer to generate gas, and a part or all of that gas is dissipated from the inside to the outside of the thermally foamable adhesive layer 22. As a result, a foaming structure is formed in the thermally foamable adhesive layer 22, and also, the adhesion area between the thermally foamable adhesive layer 22 and the support substrate 10 is reduced. Therefore, the support substrate 10 is separated, at the adhesion boundary between the support substrate 10 and the composite adhesive sheet 20, from a bonded body of the composite adhesive sheet 20 and the double-sided CCL 30; alternatively, both become easily separable, and so are mechanically peeled from each other for the separation (FIG. 2). A structural change is caused in the thermally foamable adhesive layer 22 due to foaming and degassing of the thermal foaming agent, as described above; however, the thermally foamable adhesive layer in FIG. 2 has the same reference numeral as that for the pre-foaming thermally foamable adhesive layer 22.

Any of direct heating methods and indirect heating methods may be used for a method of heating the thermally foamable adhesive layer 22. For example, a heater may be connected to an exposed surface of the support substrate 10; a lower surface (shown in the figure) of the support substrate 10 may be heated using a lamp; and alternatively, an integrated body of the support substrate 10, the composite adhesive sheet 20, and the double-sided CCL 30 may be entirely subjected to heating (heat transmission, radiation, etc.).

Next, the carrier foil layer 32b and the copper foil layer 32a of the carrier-foil coated copper foil 32 are mechanically peeled from each other at the boundary between both the layers, whereby the bonded body constituted by the copper foil layer 32a, the resin insulating layer 31, the metal layer 33, and the multilayer wiring structure formed thereon is separated from the bonded body constituted by the carrier foil layer 32b and the composite adhesive sheet 20. As a result, the wiring board 1 in the present invention, which is composed of the former bonded body, i.e., the bonded body constituted by the copper foil layer 32a, the resin insulating layer 31, the metal layer 33, and the multilayer wiring structure formed thereon, is obtained. Furthermore, the copper foil layer 32a may be patterned to form outer layer wiring.

According to the wiring board manufacturing method having the above procedure, the double-sided CCL 30 is attached to the support substrate 10 through the composite adhesive sheet 20, forming an integrated body, and the multilayer wiring structure which is the stacked layers structure of the conductive layer and the resin insulating layer is formed thereon. Accordingly, dimensional changes, distortion, deformation, etc., which might be caused due to rigidity and tenacity of the support substrate 10 during manufacturing of the wiring board 1, can be reliably prevented.

After forming the multilayer wiring structure on the double-sided CCL 30, the thermally foamable adhesive layer 22 in the composite adhesive sheet 20 is heated, whereby the thermal foaming agent contained in that layer is thermally decomposed to generate gas, and that gas is released to the outside of the thermally foamable adhesive layer 22. As a result, the adhesion area between the thermally foamable adhesive layer 22 and the support substrate 10 is reduced, and therefore, the support substrate 10 can be easily separated from the composite adhesive sheet 20 at the adhesion boundary therebetween. Accordingly, an adhesive component in the thermally foamable adhesive layer 22 is difficult to adhere to the support substrate 10, which eliminates the troublesome process involved with removing the adhesive component from the support substrate 10, enabling simple recycling of the support substrate 10.

Moreover, after separating the support substrate 10 from the remaining bonded body, the carrier foil layer 32b is peeled from the carrier-foil coated copper foil 32, whereby the bonded body constituted by the copper foil layer 32a, the resin insulating layer 31, the metal layer 33, and the multilayer wiring structure formed thereon is separated from the bonded body constituted by the carrier foil layer 32b and the composite adhesive sheet 20. As a result, an adhesive component in the adhesive layer 23 does not adhere to the copper foil layer 32a of the wiring board 1, and the outer layer wiring can be formed reliably and simply in the copper foil layer 32a. Accordingly, productivity and reliability of the wiring board 1 can be improved. Furthermore, the carrier-foil coated copper foil 32 is formed by bonding the copper foil layer 32a and the carrier foil layer 32b, which are formed as separate members, through the organic bonding layer, and therefore, the copper foil layer 32a is easily formable with a small and uniform thickness. Accordingly, the minute outer layer wiring can be formed in the copper foil layer 32a.

As described above, the present invention is not limited to the above embodiment, and various modifications of the invention can be made as long as the gist of the invention is not changed. For example, when performing lamination of the support substrate 10, the composite adhesive sheet 20, and the double-sided CCL 30, after laminating all these components, the resultant member may be subjected to press molding with an appropriate pressure, and the stacked layers of the composite adhesive sheet 20 and the double-sided CCL 30 may be attached to the support substrate 10. Also, in the composite adhesive sheet 20, the base 21 such as a PET film may not be provided. Moreover, the material for each of the copper foil layer 32a, the carrier foil layer 32b, and the metal layer 33 is not limited to copper, and other metals may be employed. A single layer or a composite layer constituted by plural layers may be employed for each of the above layers.

Furthermore, the double-sided CCL 30 may not have the metal layer 33. More specifically, instead of the double-sided CCL 30, a single-sided CCL constituted by the resin insulating layer 31 and the carrier-foil coated copper foil 32 may be used. In this case, in the formation of multilayer wiring, the metal layer 33 may be formed on the resin insulating layer 31. In addition, a thermally foamable adhesive layer may be employed as the adhesive layer 23.

As described above, according to the wiring board manufacturing method, when forming multilayer wiring by a build-up process or the like, the distortion and deformation of the wiring board, which might be caused during manufacturing, can be sufficiently prevented, and also the adhesive, etc., are prevented from adhering to the stacked layers structure formed on the support substrate, thereby reducing the effect on the subsequent manufacturing process, leading to improved productivity. In addition, recycling of the support substrate is attained. Accordingly, this method can be widely and effectively used for electronic equipment, apparatuses, modules, systems, devices, etc., each having a multilayer wiring structure, and manufacturing of the same.

What is claimed is:

1. A method of manufacturing a wiring board comprising the steps of:
   preparing a support substrate;
   providing, on the support substrate, a first composite body having a thermally foamable adhesive layer containing a thermal foaming agent and an adhesive layer, to have the thermally foamable adhesive layer attached to the support substrate;
   providing, on the first composite body, a second composite body such that the first composite body is between the support substrate and the second composite body, the second composite body having carrier-foil coated metal foil, which includes a carrier foil layer and a metal foil layer, and a resin insulating layer formed on the metal foil layer, to have the carrier foil layer attached to the first composite body, wherein the carrier-foil coated metal foil is formed by bonding the metal foil layer and the carrier foil layer via or with organic compound;
   forming the stacked layers structure on the second composite body such that the second composite body is between the first composite body and the stacked layers structure, the stacked layers structure including a conductive layer and an insulating layer;
   then, heating the thermally foamable adhesive layer to separate the support substrate from the first composite body, the second composite body, and the stacked layers structure; and
   thereafter, separating the metal foil layer and the stacked layers structure from the carrier foil layer and the first composite body at a boundary between the carrier foil layer and the metal foil layer.

2. The method of manufacturing a wiring board according to claim 1, further comprising, in the metal foil layer and the stacked layers structure which are separated from the carrier foil layer and the first composite body, patterning the metal foil layer to form outer layer wiring.

3. The method of manufacturing a wiring board according to claim 1, wherein the support substrate is made of metal.

4. The method of manufacturing a wiring board according to claim 1, wherein the first composite body has a base provided between the thermally foamable adhesive layer and the adhesive layer.

* * * * *